United States Patent
Krone (10) Patent No.: US 7,081,796 B2
(45) Date of Patent: Jul. 25, 2006

(54) RADIO FREQUENCY LOW NOISE AMPLIFIER WITH AUTOMATIC GAIN CONTROL

(75) Inventor: Andrew W. Krone, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 56 days.

(21) Appl. No.: 10/779,100

(22) Filed: Feb. 11, 2004

(65) Prior Publication Data

US 2005/0057305 A1    Mar. 17, 2005

(51) Int. Cl.
H03F 3/45 (2006.01)
(52) U.S. Cl. .................. 330/254; 330/129; 330/136; 330/252; 330/253; 330/284; 330/285; 455/115; 455/126
(58) Field of Classification Search .............. 330/252, 330/254
See application file for complete search history.

(56) References Cited

U.S. PATENT DOCUMENTS

| | | | |
|---|---|---|---|
| 3,984,783 A | | 10/1976 | Bickley |
| 4,317,083 A | * | 2/1982 | Boyd .................. 330/296 |
| 4,344,043 A | * | 8/1982 | Harford ............... 330/254 |
| 5,384,501 A | * | 1/1995 | Koyama et al. ...... 327/336 |
| 6,035,186 A | | 3/2000 | Moore et al. |
| 6,047,167 A | * | 4/2000 | Yamashita ............ 455/126 |
| 6,278,321 B1 | * | 8/2001 | Franck ................. 330/254 |
| 6,342,813 B1 | * | 1/2002 | Imbornone et al. ... 330/254 |
| 6,366,166 B1 | * | 4/2002 | Belot .................. 330/252 |
| 6,414,547 B1 | * | 7/2002 | Shkap ................. 330/254 |
| 6,480,058 B1 | * | 11/2002 | Blanken ............... 327/563 |
| 6,489,838 B1 | * | 12/2002 | Tsinker ................ 327/557 |
| 6,529,100 B1 | | 3/2003 | Okanobu |
| 6,605,996 B1 | * | 8/2003 | Yu et al. .............. 330/253 |
| 6,639,468 B1 | * | 10/2003 | Belot .................. 330/252 |
| 6,735,420 B1 | * | 5/2004 | Baldwin .............. 455/127.2 |

(Continued)

FOREIGN PATENT DOCUMENTS

| | | |
|---|---|---|
| EP | 0 711 031 A1 | 8/1996 |
| EP | 1 134 890 A | 9/2001 |

OTHER PUBLICATIONS

Thomas H. Lee, The Design of CMOS Radio-Frequency Integrated Circuits, Cambridge University Press, 1998, unknown month, pp. 288-295.

(Continued)

Primary Examiner—Rexford Barnie
Assistant Examiner—Khai Nguyen
(74) Attorney, Agent, or Firm—Larson Newman Abel Polanky & White, LLP (57) ABSTRACT

A low noise amplifier (500) includes a first transconductance device (326) having a control electrode for receiving a first input signal, and a first current electrode; a first load device (322) having a first terminal coupled to a first power supply voltage terminal and a second terminal coupled to the first current electrode of the first transconductance device (326) and forming a first output voltage signal; a second transconductance device (336) having a control electrode for receiving a second input signal, and a second current electrode; a second load device (332) having a first terminal coupled to the first power supply voltage terminal and a second terminal coupled to the first current electrode of the second transconductance device (336) and forming a second output voltage signal; and an attenuation device (340) coupled between the first current electrodes of the first (326) and second (336) transconductance devices and having a control input terminal for receiving a control voltage thereon.

31 Claims, 7 Drawing Sheets

U.S. PATENT DOCUMENTS

| | | | |
|---|---|---|---|
| 6,735,424 B1 * | 5/2004 | Larson et al. | 455/250.1 |
| 6,756,848 B1 * | 6/2004 | Garcia et al. | 330/278 |
| 2003/0155972 A1 | 8/2003 | Ngo et al. | |

OTHER PUBLICATIONS

Hornak, Tom, "Using Polyphase Filters As Image Attenuators." RF Signal Processing, www.rfdesign.com, pp. 26-34, Jun. 2001.

Lee, Thomas H., "The Design of CMOS Radio-Frequency Integrated Circuits." The Press Syndicate of the University of Cambridge, New York, NY, pp. 556-561, 1998, unknown month.

"900MHZ Image-Reject Transceivers," Maxim Integrated Products, Sunnyvale, California, 19-1234, Rev. 5, 8/03pp. 1-14, Aug. 2003.

* cited by examiner

RADIO FREQUENCY LOW NOISE AMPLIFIER WITH AUTOMATIC GAIN CONTROL

This application is related to copending U.S. Provisional Application No. 60/503,010, which is entitled "SATELLITE RADIO RECEIVER" and was filed Sep. 15, 2003, and to U.S. Provisional Application No. 60/514,067, which is entitled "SATELLITE RADIO TUNER PRODUCT" and was filed Oct. 24, 2003, both of which are incorporated herein by reference in their entirety.

TECHNICAL FIELD

The present invention generally relates to amplifiers, and more particularly to low noise amplifiers for use in radio frequency equipment or the like.

BACKGROUND

Radio frequency (RF) devices transmit an information signal from one point to another by moving the information signal to a higher frequency range that is more suitable for transmission over the medium being used. This process is known as upconversion. As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. An RF transmitter mixes the desired signal, known as the baseband signal, with an RF carrier frequency for transmission over the selected medium. An RF receiver then mixes the signal with the carrier frequency to restore the signal to its original frequency.

In a typical RF receiver the RF signal is received by an antenna, then amplified using a fixed gain amplifier and transmitted over a transmission line having a characteristic impedance to the receiver circuitry. Since the received RF signal strength can vary significantly depending on the distance between the receiver and the transmitter, RF receivers typically include a circuit for automatic gain control (AGC). AGC is helpful to the operation of the receiver because it helps to keep the power level of the received signal close to the optimal level. The signal at the other end of the transmission line is then typically amplified in a variable gain low noise amplifier (LNA) whose gain is controlled by the AGC circuit before being converted from RF to baseband.

One known method of AGC uses a variable resistor T-network. This T-network includes resistors that whose resistances can be made to vary together. The T-network allows the transmission line termination impedance to be kept at the desired value while the signal is properly attenuated, resulting in near optimal power transfer. However resistor T-networks exist as discrete components, which add to system cost. Furthermore resistor T-networks are not very accurate when implemented in conventional, low-cost CMOS integrated circuits. It would be desirable, therefore, to provide new RF circuitry capable of integration but with performance comparable to or better than such known discrete circuits.

BRIEF SUMMARY

In one form a low noise amplifier includes first and second transconductance devices, first and second load devices, and an attenuation device. The first transconductance device has a control electrode for receiving a first input signal, and a first current electrode. The first load device has a first terminal coupled to a first power supply voltage terminal and a second terminal coupled to the first current electrode of the first transconductance device and forming a first output voltage signal thereon. The second transconductance device has a control electrode for receiving a second input signal, and a second current electrode. The second load device has a first terminal coupled to the first power supply voltage terminal and a second terminal coupled to the first current electrode of the second transconductance device and forming a second output voltage signal thereon. The attenuation device is coupled between the first current electrode of the first transconductance device and the first current electrode of the second transconductance device, and has a control input terminal for receiving a control voltage thereon.

In one particular embodiment of the low noise amplifier the attenuation device advantageously includes a plurality of exponentially-weighted attenuation devices. The exponentially-weighted attenuation devices may be controlled by a plurality of control signals, together comprising the control signal, coupled to corresponding ones of the plurality of the exponentially-weighted attenuation devices.

In another form a low noise amplifier includes an amplifier and a bias circuit. The amplifier has a first input terminal for receiving a first input signal, a first output terminal for providing a first output signal, and a feedback input terminal for receiving a control voltage, wherein the control voltage determines a gain of the amplifier. The bias circuit has an input terminal for receiving a control signal, and an output terminal coupled to the first input terminal of the amplifier for providing a bias voltage thereto. The bias circuit is responsive to the control signal to operate in one of first and second modes. In the first mode the bias circuit biases the amplifier to operate in a substantially constant transconductance mode, and in the second mode the bias circuit biases the amplifier to operate in a substantially constant saturation voltage mode.

In yet another form an integrated circuit receiver includes first and second layout blocks. The first layout block includes a low noise amplifier having an input terminal for receiving an input signal and a first output terminal for providing a first amplified voltage substantially proportional to the input signal, and a first transconductance device having an input terminal coupled to the first output terminal of the low noise amplifier, and an output terminal for providing a first current signal. The second layout block has an input terminal coupled to the output terminal of the first transconductance device, and an output terminal for providing a first tuned signal having significant signal energy at a different frequency than the input signal, wherein the first transconductance device and the second layout block together function as a mixer of the integrated circuit receiver.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
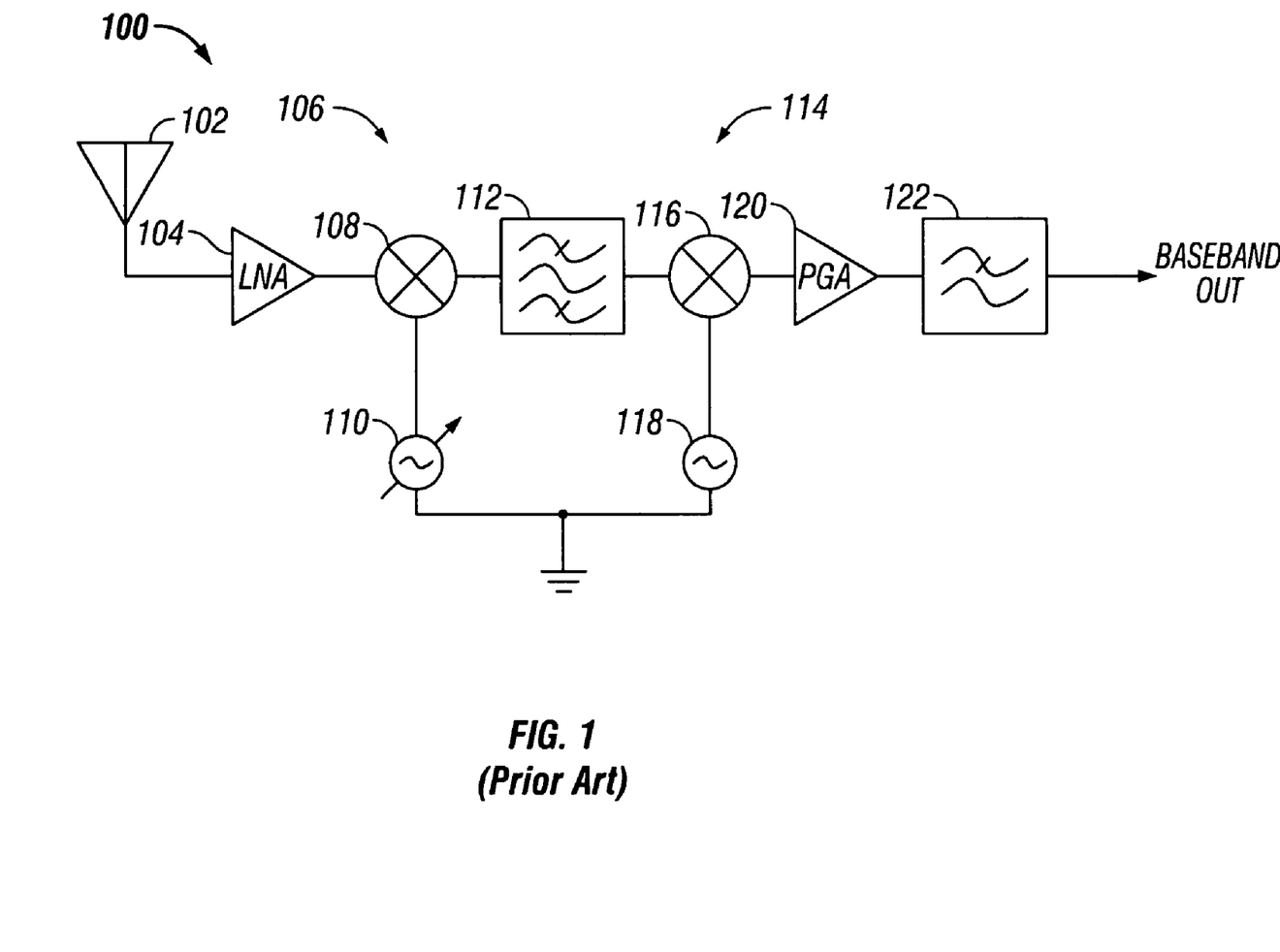
FIG. 1 illustrates in partial block diagram and partial schematic form a radio receiver known in the prior art.

FIG. 1 illustrates in partial block diagram and partial schematic form a radio receiver 100 known in the prior art. Receiver 100 is a superheterodyne receiver that includes generally an antenna 102, a low noise amplifier labeled "LNA" 104, an RF to IF mixer 106, a bandpass filter 112, an IF to baseband mixer 114, a programmable gain amplifier labeled "PGA" 120, and a lowpass filter 122. Amplifier 104 has an input terminal connected to antenna 102, and an output terminal, and amplifies a broadband signal received on antenna 102 to provide an amplified signal to the output terminal thereof. Mixer 106 mixes the amplified signal to IF as follows. Mixer 106 includes a multiplier 108 and a tunable oscillator 110. Multiplier 108 has a first input terminal connected to the output terminal of amplifier 104, a second input terminal, and an output terminal. Tunable oscillator 110 has a tuning input terminal and an output terminal that provides an RF local oscillator (LO) signal referenced to a ground voltage received at a ground terminal thereof. The RF LO signal is selected by the tuning input to have a frequency such that a desired channel is mixed from RF to a selected IF, which is also the center frequency of bandpass filter 112. Bandpass filter 112 has an input terminal connected to the output terminal of multiplier 108, and an output terminal for providing an output signal with significant signal energy in a passband centered around the chosen IF, and with significant attenuation of signal energy in a stopband outside the passband.

This signal at the output of bandpass filter 112 is then mixed to baseband in mixer 114. Mixer 114 includes a multiplier 116 and an oscillator 118. Multiplier 116 has a first input terminal connected to the output terminal of bandpass filter 112, a second input terminal, and an output terminal. Oscillator 118 provides an IF LO signal between an output terminal thereof and ground received at a ground terminal. The IF LO signal is selected to have an output frequency chosen to mix the selected IF signal to baseband, and multiplier 116 thus provides the output signal thereof at baseband. Amplifier 120 is provided to amplify this signal to a desired level, and has an input terminal connected to the output terminal of multiplier 116, and an output terminal. Filter 122 has an input terminal connected to the output terminal of amplifier 120, and an output terminal for providing an output signal of receiver 100 labeled "BASEBAND OUT".

Figure 2:
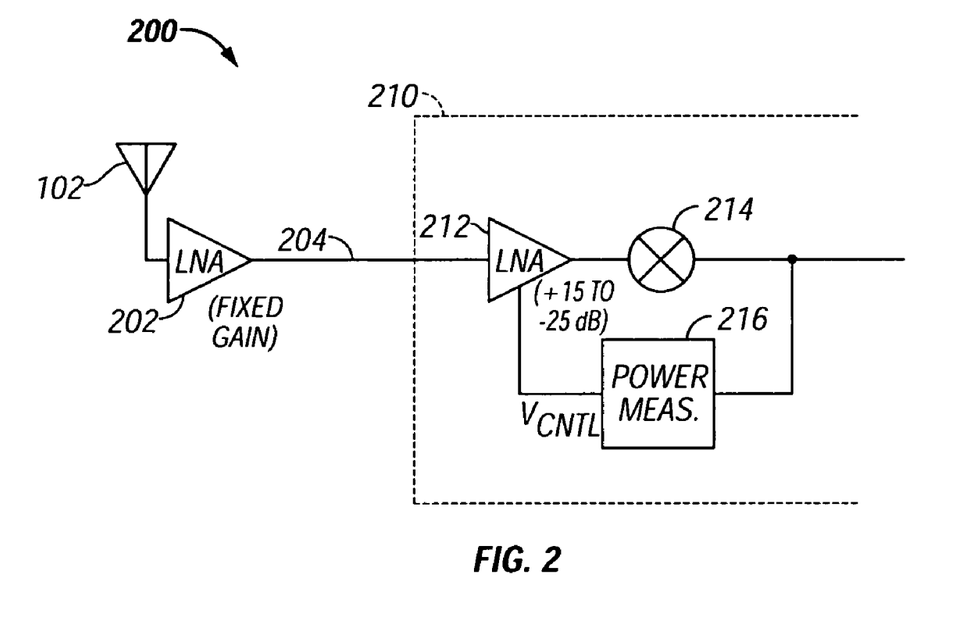
FIG. 2 illustrates in partial block diagram and partial schematic form a portion of a radio receiver according to the present invention.

FIG. 2 illustrates in partial block diagram and partial schematic form a portion of a radio receiver 200 according to the present invention. Radio receiver 200 includes generally antenna 102, a first LNA 202, a transmission line 204, and an integrated circuit 210 including the radio receiver. LNA 202 is physically located adjacent to antenna 102 and has an input terminal connected to antenna 202, and an output terminal connected to a first end of transmission line 204 nearest antenna 102. Integrated circuit 210 is connected to a second end of transmission line 204 opposite antenna 102 and includes an LNA 212, a multiplier 214, and a power measurement block 216. LNA 212 has an input terminal connected to the second end of transmission line 204, a gain control input terminal for receiving a control voltage labeled "$V_{CNTL}$", and an output terminal. Multiplier 214 has a first input terminal connected to the output terminal of LNA 212, a second input terminal (not shown) for receiving an RF LO signal, and an output terminal. Power measurement block 216 has an input terminal connected to the output terminal of multiplier 214, and an output terminal connected to the gain control input terminal of LNA 212 for providing control voltage $V_{CNTL}$.

In operation, the RF signal received by antenna 102 is amplified in two parts, the first part by fixed gain LNA 202 and the second part by variable gain LNA 212. The two amplifiers are separated by a transmission line having a 50-ohm characteristic impedance. Since the signal strength may vary over a wide range depending on how close the receiver is to the transmitter, the on-chip LNA must provide either gain or attenuation. In the illustrated radio receiver, LNA 212 has a variable gain in the range of +15 decibels (dB) to −25 dB, but it should be apparent that this gain range may vary in other embodiments. To provide the proper amount of gain, LNA 212 is part of an automatic gain control (AGC) loop formed by multiplier 214 and power measurement block 216. In other embodiments power measurement block 216 could measure the power at the output of LNA 212. However due to the superheterodyne design of the receiver, power measurement block 216 advantageously measures the power at the output of multiplier 214 that has been mixed to a fixed IF, simplifying the design of power measurement block 216. The AGC loop works to keep the power at the output of multiplier 214 constant by providing a control voltage ($V_{CNTL}$) as a feedback signal to LNA 212. As will be described further with reference to FIGS. 3–9 below, LNA 212 has several significant advantages over known LNAs.

Figure 3:
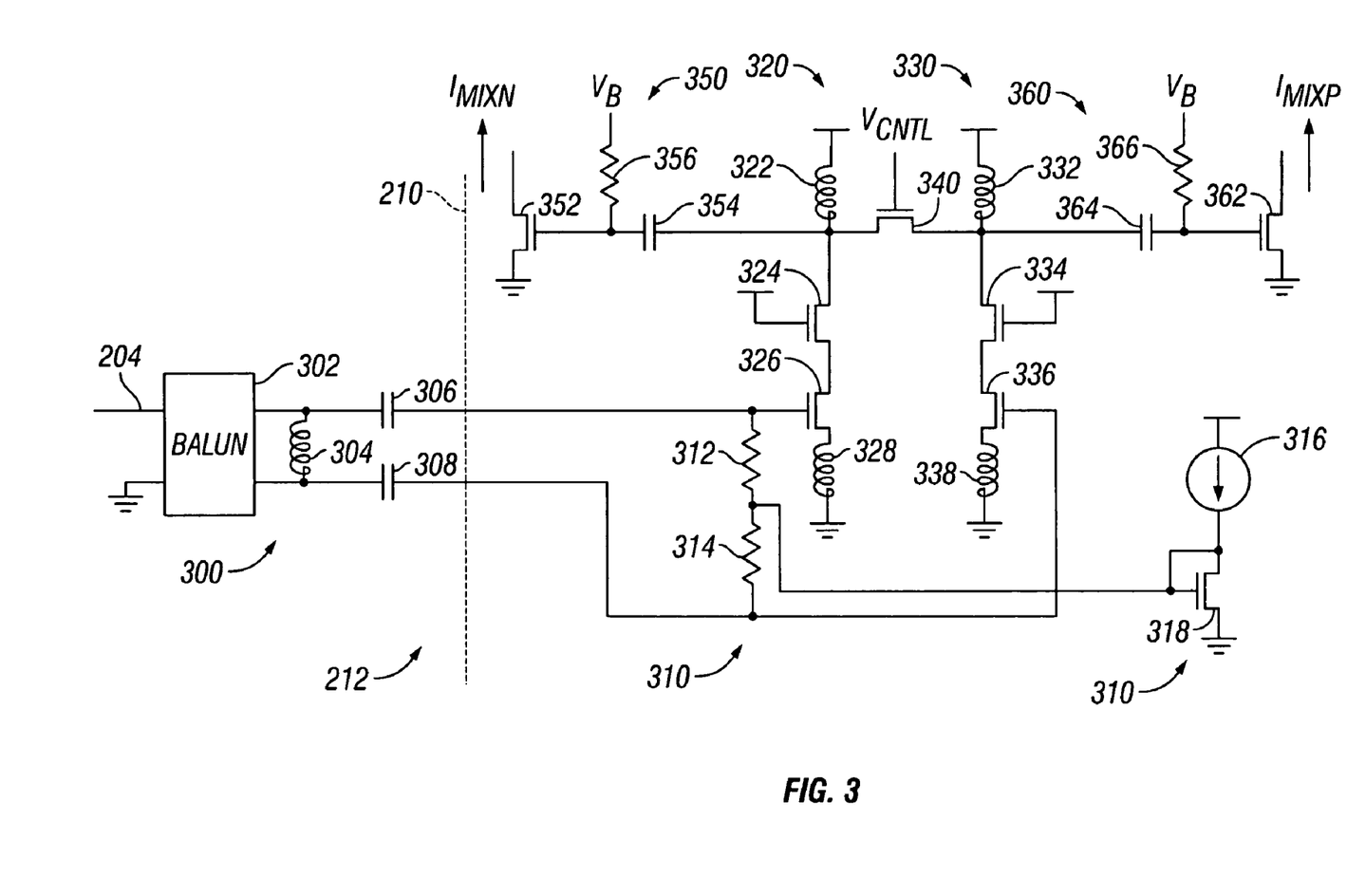
FIG. 3 illustrates in partial block diagram and partial schematic form the low noise amplifier of FIG. 2.

FIG. 3 illustrates in partial block diagram and partial schematic form low noise amplifier 212 of FIG. 2. LNA 212 includes generally an input portion 300, a bias circuit 310, an amplifier 320, an attenuation device 340, a first output transconductance portion 350, and a second output transconductance portion 360. Input portion 300 includes generally a balun transformer 302, an inductor 304, and capacitors 306 and 308. Balun transformer 302 has a first input terminal connected to the second end of transmission line 204, a second input terminal connected to a ground power supply voltage terminal, typically at 0 volts, and first and second output terminals. Inductor 304 has first and second terminals respectively connected between the first and second output terminals of balun transformer 302. Capacitor 306 has a first terminal connected to the first output terminal of balun transformer 302, and a second terminal for providing a first input signal. Capacitor 308 has a first terminal connected to the second output terminal of balun transformer 302, and a second terminal for providing a second input signal. The first and second input signals form a differential signal pair corresponding to the signal at the second end of transmission line 204, to amplifier 320.

Bias circuit 310 includes resistors 312 and 314, a current source 316, and an N-channel MOS transistor 318. Resistor 312 has a first terminal connected to the second terminal of capacitor 306, and a second terminal. Resistor 314 has a first terminal connected to the second terminal of capacitor 308, and a second terminal connected to the second terminal of resistor 312. Current source 316 has a first terminal connected to a positive power supply voltage terminal conventionally designated "$V_{DD}$" in MOS integrated circuits, and a second terminal. Note that while $V_{DD}$ is designated generically herein, it may assume different values for different circuits, such as 5.0 volts for biasing circuitry and 2.5 volts for LNA 212. Transistor 318 has a drain connected to the second terminal of current source 316 and to the second terminals of resistors 312 and 314, a gate connected to the drain thereof, and a source connected to ground.

Amplifier 320 includes an inductor 322, N-channel MOS transistors 324 and 326, an inductor 328, an inductor 332, N-channel MOS transistors 334 and 336, and an inductor 338. Inductor 322 has a first terminal connected to $V_{DD}$, and a second terminal. Transistor 324 has a drain connected to the second terminal of inductor 322, a gate connected to $V_{DD}$, and a source. Transistor 326 has a drain connected to the source of transistor 324, a gate connected to the second terminal of capacitor 306 for receiving the first input signal, and a source. Inductor 328 has a first terminal connected to the source of transistor 326, and a second terminal connected to ground. Inductor 332 has a first terminal connected to $V_{DD}$, and a second terminal. Transistor 334 has a drain connected to the second terminal of inductor 332, a gate connected to $V_{DD}$, and a source. Transistor 336 has a drain connected to the source of transistor 334, a gate connected to the second terminal of capacitor 308 for receiving the second input signal, and a source. Inductor 338 has a first terminal connected to the source of transistor 336, and a second terminal connected to ground.

Attenuation device 340 is illustrated as an N-channel MOS transistor having a first source/drain terminal connected to the second terminal of inductor 322, a gate for receiving control voltage $V_{CNTL}$, and a second source/drain terminal connected to the second terminal of inductor 332. As will be described further with respect to FIG. 4 below, transistor 340 may be advantageously implemented as a series of exponentially-weighted transistors connected in parallel that are switched by corresponding control signals for better log-linearity. As used herein, log-linearity means a log change in gain for a linear change in the control voltage $V_{CNTL}$.

First output transconductance portion 350 includes an N-channel transistor 352, a capacitor 354, and a resistor 356. Transistor 352 has a drain for providing a first output current labeled "$I_{MIXN}$", a gate, and a source connected to ground. Capacitor 354 has a first terminal connected to the second terminal of inductor 322, and a second terminal connected to the gate of transistor 352. Resistor 356 has a first terminal for receiving an intermediate bias voltage labeled "$V_B$", and a second terminal connected to the gate of transistor 352. Second output transconductance stage 360 includes an N-channel transistor 362, a capacitor 364, and a resistor 366. Transistor 362 has a drain for providing a first output current labeled "$I_{MIXP}$", a gate, and a source connected to ground. Capacitor 364 has a first terminal connected to the second terminal of inductor 332, and a second terminal connected to the gate of transistor 362. Resistor 366 has a first terminal for receiving $V_B$, and a second terminal connected to the gate of transistor 362.

As shown in FIG. 3, input portion is external to integrated circuit 210 but the other components are implemented on-chip. Since LNA 212 must terminate a 50-ohm transmission line, amplifier 320 uses MOS transistors having source degeneration inductors. The 50-ohm transmission line is input to one end of balun transformer 302 for conversion to a differential signal. Inductor 304 and capacitors 306 and 308 form an impedance transformation network that transforms the 200 ohm characteristic output impedance of balun transformer 302 to the impedance looking into the device. Transistors 326 and 336 form a pair of gain devices and inductors 328 and 338 form a partially real impedance looking into the gates of transistors 326 and 336 from the matching network.

Transistor pair 326 and 336 is biased using current source 316 and diode-connected transistor 318. The mirror voltage at the drain of transistor 318 is connected through large-valued resistors 312 and 314 to set the constant (DC) current through transistors 326 and 336. The outputs of amplifier 320 at the drains of cascode transistors 324 and 334 are currents which are transformed into voltages by the load impedances. These voltages are input to output transconductance portions 350 and 360 which form the front end of multiplier 314, which has a nominally capacitive input. To provide additional gain, inductors 322 and 332 are sized to resonate with this capacitance (around the carrier frequency of the RF signal).

In an alternate configuration of the amplifier, the two source degeneration inductors could have their first terminals connected to the sources of transistors 326 and 336, respectively, and second terminals connected together and through a tail current source to ground. In this alternate embodiment the drain of transistor 318 could be connected to the gate of an MOS transistor of appropriate size that functions as the tail current source. However amplifier 320 is slightly more linear and has more headroom than this alternate amplifier, and these advantages are important in certain applications.

The outputs from amplifier 320 are AC-coupled using capacitors 354 and 364 into transistors 352 and 362, which are transconductance (gm) devices. Being MOS devices, transistors 352 and 362 have a significant gate-to-source capacitance ($C_{gs}$) which provides the majority of the capacitive load seen by the drains of transistors 324 and 334. If the total capacitive load seen from the drain of either transistor 324 or transistor 334 is equal to $C_{TOT}$, then the inductance $L_L$ of inductors 322 and 332 would be chosen to satisfy the equation:

$$2\pi f_0 = \frac{1}{\sqrt{L_L C_{TOT}}} \quad [1]$$

where $f_0$ is the center frequency of the desired operation frequency band, i.e. the carrier frequency. Although ideal inductors and capacitors would provide for an infinite amount of impedance and thus infinite voltage gain at $f_0$, series resistance in $L_L$ and $C_{gs}$ reduces the maximum impedance to approximately a few hundred ohm.

Attenuation element 340 provides variable attenuation for use in the AGC loop by providing a resistive differential load between the two legs of amplifier 320. Attenuation element 340 can further reduce the impedance in the load from a few hundred ohms down to a few ohms, reducing the overall gain by about 40 dB. For full gain, control voltage $V_{CNTL}$ is set to zero volts. For a full attenuation, control voltage $V_{CNTL}$ is at its maximum possible value.

Figure 4:
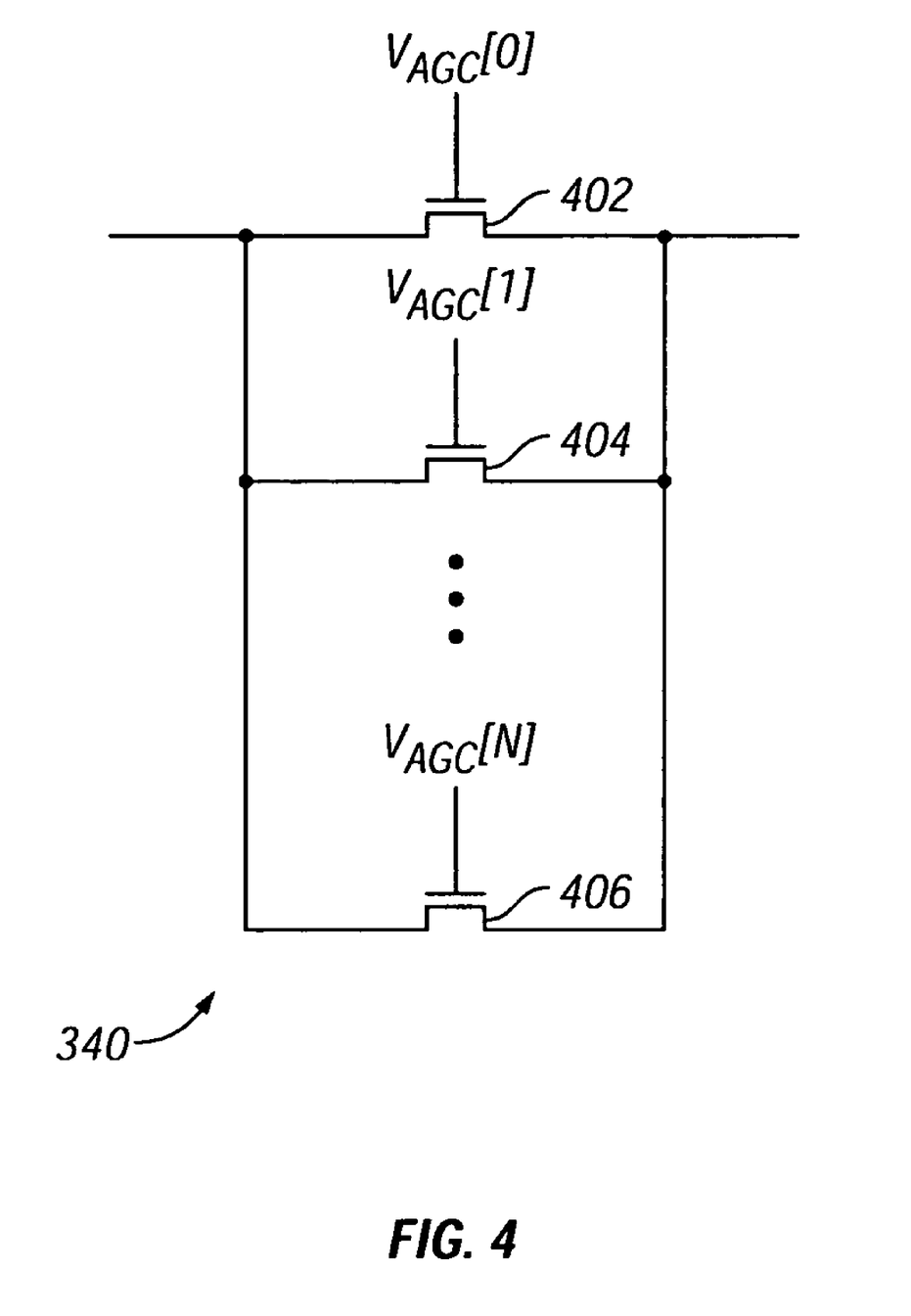
FIG. 4 illustrates in schematic form an implementation of the attenuation device of FIG. 3.

FIG. 4 illustrates in schematic form an implementation of attenuation device 340 of FIG. 3 that provides a log-linear characteristic between gain and control voltage $V_{CNTL}$. Attenuation device 340 includes a set of exponentially-sized N-channel MOS transistors connected in parallel, including representative transistors 402, 404, and 406. Transistor 402 has a first source/drain terminal providing the first current electrode of attenuation device 340, a gate for receiving a control signal labeled "$V_{AGC}[0]$", and a second source/drain terminal providing the second current electrode of attenuation device 340. Transistor 404 has a first source/drain terminal connected to the first source/drain terminal of transistor 402, a gate for receiving a control signal labeled "$V_{AGC}[1]$", and a second source/drain terminal connected to the second source/drain terminal of transistor 402. Transistor 406 has a first source/drain terminal connected to the first source/drain terminal of transistor 402, a gate for receiving control signal labeled "$V_{AGC}[N]$", and a second source/drain terminal connected to the second source/drain terminal of transistor 402. Additional transistors between 2 and N are present in attenuation device 340 but are omitted from FIG. 4. Each transistor k has a width-to-length ratio (W/L) that is $2^k$ times the W/L of transistor 402. Thus if transistor 402 has a W/L designated $M_A$, then transistor 404 has $2^1=2$ times $M_A$, and transistor 406 has an area equal to $2^N$ times $M_A$. The total area is equal to $2^{N+1}$ times $M_A$.

Figure 5:
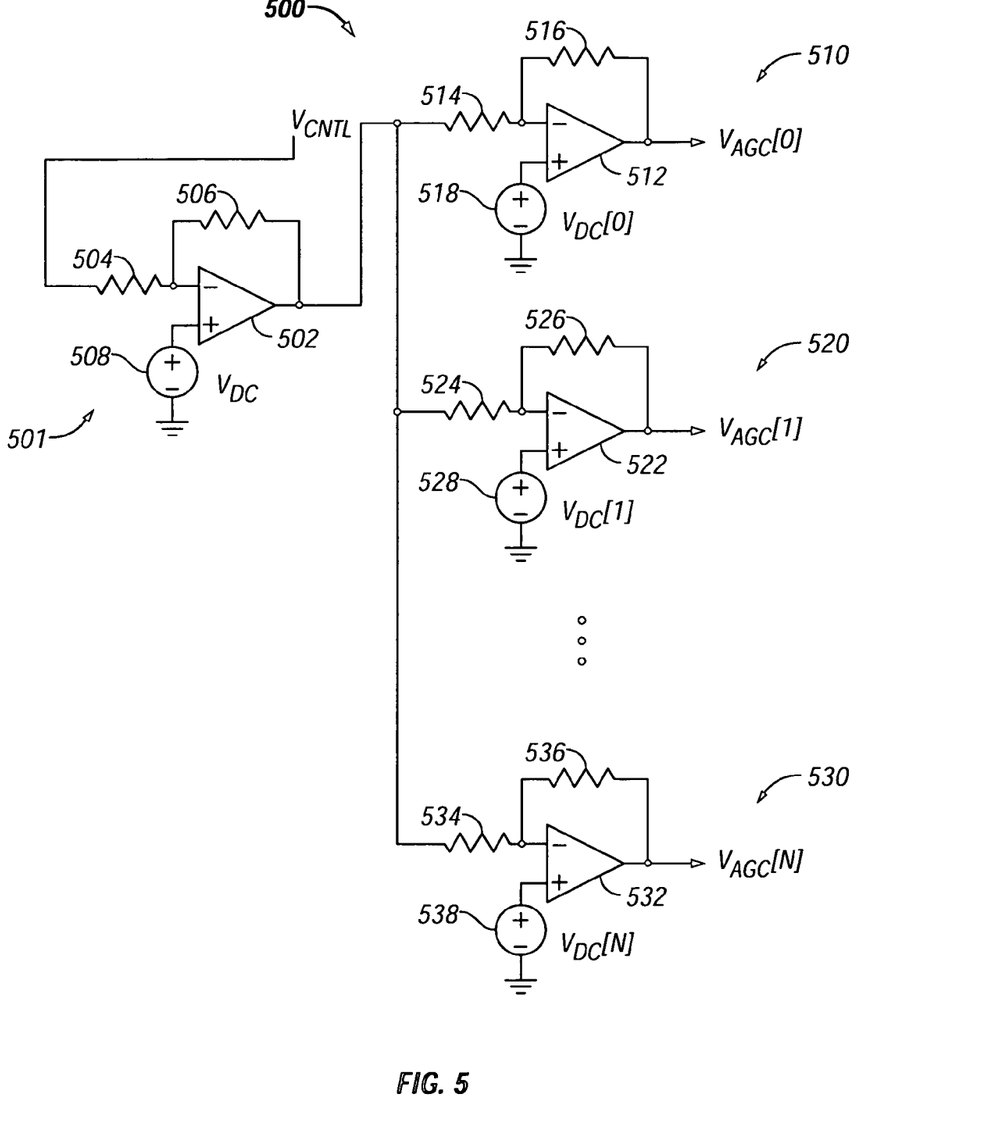
FIG. 5 illustrates in partial block diagram and partial schematic form a voltage conversion circuit for use with the attenuation device of FIG. 4.

FIG. 5 illustrates in partial block diagram and partial schematic form a voltage conversion circuit 500 for use with attenuation device 340 of FIG. 4. Voltage conversion circuit 500 has an input stage 501 and N conversion circuits corresponding to each of the N transistors of attenuation device 340, including representative conversion circuits 510, 520, and 530 providing voltages $V_{AGC}[0]$, $V_{AGC}[1]$, and $V_{AGC}[N]$, respectively. Input stage 501 includes an operational amplifier 502, resistors 504 and 506, and a voltage supply 508. Operational amplifier 502 has a negative input terminal for receiving control voltage $V_{CNTL}$ through resistor 504, a positive input terminal, and an output terminal connected to the negative input terminal through resistor 506. Voltage supply 508 has a positive terminal connected to the positive input terminal of operational amplifier 512, and a negative terminal connected to ground, and provides a reference voltage labeled "$V_{DC}$" between the positive and negative terminals thereof. Each conversion circuit is constructed similarly. Conversion circuit 510 includes an operational amplifier 512, resistors 514 and 516, and a voltage supply 518. Operational amplifier 512 has a negative input terminal connected to the output terminal of operational amplifier 502 through resistor 514, a positive input terminal, and an output terminal connected to the negative input terminal through resistor 516 and providing control signal $V_{AGC}[0]$. Voltage supply 518 has a positive terminal connected to the positive input terminal of operational amplifier 512, and a negative terminal connected to ground, and provides a reference voltage labeled "$V_{DC}[0]$" between the positive and negative terminals thereof. Conversion circuit 520 includes an operational amplifier 522, resistors 524 and 526, and a voltage supply 528. Operational amplifier 522 has a negative input terminal connected to the output terminal of operational amplifier 502 through resistor 524, a positive input terminal, and an output terminal connected to the negative input terminal through resistor 526 and providing control signal $V_{AGC}[1]$. Voltage supply 528 has a positive terminal connected to the positive input terminal of operational amplifier 522, and a negative terminal connected to ground, and provides a reference voltage labeled "$V_{DC}[1]$" between the positive and negative terminals thereof. Conversion circuit 530 includes an operational amplifier 532, resistors 534 and 536, and a voltage supply 538. Operational amplifier 532 has a negative input terminal connected to the output terminal of operational amplifier 502 through resistor 534, a positive input terminal, and an output terminal connected to the negative input terminal through resistor 536 and providing control signal $V_{AGC}[N]$. Voltage supply 538 has a positive terminal connected to the positive input terminal of operational amplifier 532, and a negative terminal connected to ground, and provides a reference voltage labeled "$V_{DC}[N]$" between the positive and negative terminals thereof.

To generate the desired log-linear effect, each $V_{AGC}[k]$ is a control signal that is a gained up, DC shifted version of control voltage $V_{CNTL}$. Each control signal $V_{AGC}[k]$ is DC shifted by a different amount (determined by $V_{DC}[k]$) so that each transistor becomes active at a different value of control voltage $V_{CNTL}$. Thus control voltage $V_{CNTL}$ can be thought of as including or corresponding to a set of $V_{AGC}[k]$ control signals for k=0 to N.

Figure 6:
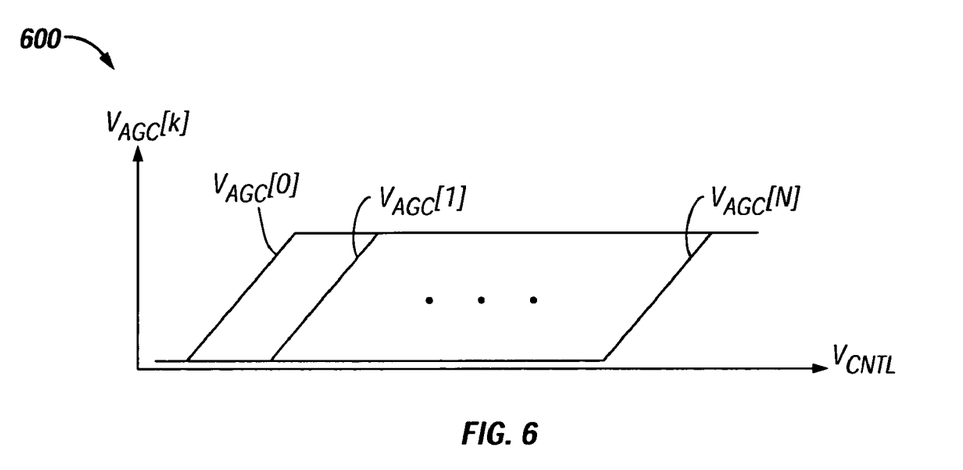
FIG. 6 illustrates a graph of the output voltages of the voltage conversion circuit of FIG. 5.

FIG. 6 illustrates a graph 600 of the output voltages of voltage conversion circuit 500 of FIG. 5. In FIG. 6 the vertical axis indicates the voltage of control signals $V_{AGC}[k]$ for k=0 to N, whereas the horizontal axis represents control voltage $V_{CNTL}$ in volts. Thus in FIG. 6 several curves are superimposed on each other at different values of $V_{CNTL}$. As control voltage $V_{CNTL}$ increases, successive control signals $V_{AGC}[k]$ transition smoothly from a low voltage to a high voltage. Shown in FIG. 6 are representative control signals $V_{AGC}[0]$, $V_{AGC}[1]$, $V_{AGC}[2]$, and $V_{AGC}[N]$. The transition of a succeeding signal begins at about the voltage of control voltage $V_{CNTL}$ at which the previous control signal $V_{AGC}$ has completed its transition. However through selection of appropriate values of $V_{DC}[k]$ the transition periods are made to overlap slightly to make the attenuation characteristic more log-linear with respect to $V_{CNTL}$.

Returning briefly to FIG. 3, note that the DC bias current through transistors 326 and 336 is set by current source 316 providing a bias current $I_B$ through diode-connected transistor 318. To minimize the change in input impedance and noise figure and gain over manufacturing process and temperature variations, a constant transconductance biasing scheme is desirable. This feature is most important when the AGC loop requires full gain. A constant transconductance biasing scheme provides a bias current $I_B$ to keep the transconductance of transistors 326 and 336 substantially constant across expected process and temperature variations.

However once the gain begins to be reduced by the operation of the AGC loop when the input signal strength increases, the consistency of the gain and noise figure becomes less important. Under the smaller gain condition, the gain consistency only needs to be monotonic (and roughly log-linear, as described above) so that the closed loop AGC can keep the mixer output at constant power. As the signal grows very large and the gain is further reduced, linearity of the LNA becomes the primary concern. To maximize linearity, the saturation voltage ($V_{DSAT}$) of transistors 326 and 336 should be maximized. Unfortunately, constant transconductance biasing does not maximize $V_{DSAT}$ and on the contrary, $V_{DSAT}$ can typically vary by 2–3 times between the fast processing corner at cold temperature and the slow processing corner at hot temperature.

To improve linearity in these low gain regions of operation while maintaining the desirable properties of constant transconductance biasing at high gain, the inventor has added a new biasing mode known as the constant $V_{DSAT}$ mode. In the constant $V_{DSAT}$ mode, bias current source 316 provides a bias current $I_B$ to keep the saturation voltage of transistors 326 and 336 substantially constant across expected process and temperature variations. This mode is described with respect to FIG. 7, which illustrates in schematic form an implementation of bias current source 316 of FIG. 3. Bias current source 316 includes generally a current mirror 700, a first current source 710, a second current source 720, and an N-channel transistor 730. Current mirror 700 includes P-channel MOS transistors 702 and 704. Transistor 702 has a source connected to $V_{DD}$, a gate, and a drain connected to the gate thereof and serving as an input of the current mirror. Transistor 704 has a source connected to $V_{DD}$, a gate connected to the drain of transistor 702, and a drain providing an output terminal of current mirror 700 and of current source 316 and providing current $I_B$ therefrom.

Figure 7:
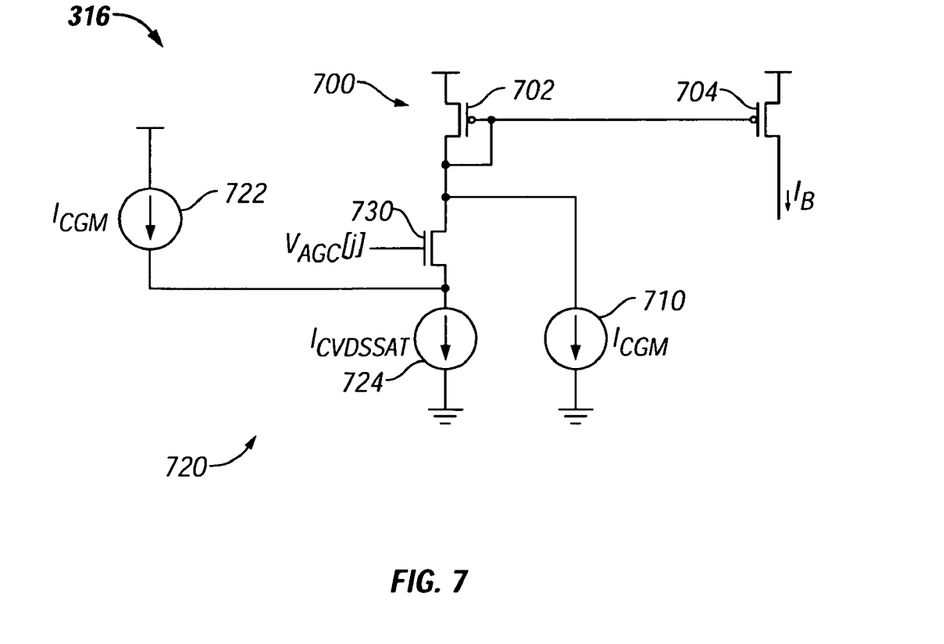
FIG. 7 illustrates in schematic form an implementation of the bias current source of FIG. 3.

Current source 710 has a first terminal connected to the drain of transistor 702, and a second terminal connected to $V_{SS}$. Current source 710 conducts a current labeled "$I_{cgm}$" associated therewith to cause LNA 212 to operate with substantially constant transconductance.

Current source 720 includes current sources 722 and 724. Current source 722 has a first terminal connected to $V_{DD}$, and a second terminal, and conducts a current equal to $I_{CGM}$. Current source 724 has a first terminal connected to the second terminal of current source 722, and a second terminal connected to ground, and conducts a current labeled "$I_{CVDSSAT}$". Transistor 730 has a drain connected to the drain of transistor 702, a gate for receiving a control signal labeled "$V_{AGC}[j]$", and a source connected to the first terminal of current source 724.

Figure 8:
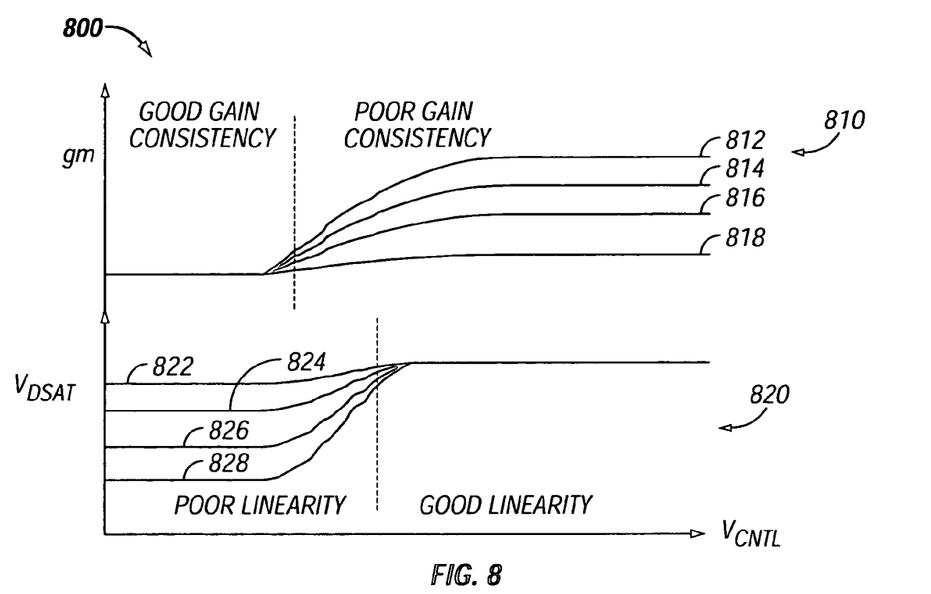
FIG. 8 illustrates a graph of various parameters associated with the implementation of the bias current source of FIG. 7.

The operation of current source 316 can be better understood with reference to FIG. 8, which illustrates a graph 800 of various parameters associated with the implementation of bias current source 316 of FIG. 7. In graph 800, the horizontal axis depicts control voltage $V_{CNTL}$ in volts. FIG. 8 depicts two quantities on separate sections of the vertical axis. The first section is gm, in mhos, and the second section is $V_{DSAT}$, in volts. The $V_{CNTL}$-gm section includes a first set of characteristic curves 810 representing normal variation over process and temperature and including curves 812, 814, 816, and 818. For low $V_{CNTL}$ (high gain), gm is relatively constant over process and temperature variations and amplifier 320 demonstrates good gain consistency. However as $V_{CNTL}$ increases further, curves 812, 814, 816, and 818 separate in a poor gain consistency region. The $V_{CNTL}$-$V_{DSAT}$ section includes a second set of characteristic curves 820 including curves 822, 824, 826, and 828. For high $V_{CNTL}$, $V_{DSAT}$ demonstrates good linearity and is relatively constant across process and temperature. However as $V_{CNTL}$ decreases, curves 822, 824, 826, and 828 separate in a poor linearity region.

The inventor discovered that it would be advantageous to dynamically change the bias mode of the amplifier based on the amount of gain required by the AGC loop. When the AGC loop causes LNA 212 to operate with high gain, constant transconductance mode is selected to provide good gain consistency. When the AGC loop causes LNA 212 to operate with low gain, constant $V_{DSAT}$ mode is selected to provide good linearity. Switching between constant transconductance mode and constant saturation voltage mode can be easily achieved by using an appropriate one of the $V_{AGC}$ control signals, designated $V_{AGC}[j]$. In other embodiments in which attenuation device 340 is not separated, control voltage $V_{CNTL}$ itself could be used to change between the two modes. Now referring to FIG. 7 as well, in constant transconductance mode transistor 730 is nonconductive and bias circuit 316 provides constant current $I_{CGM}$ as $I_B$. In constant saturation voltage mode transistor 730 is conductive and provides current $I_{CVDSSAT}$ as $I_B$.

Figure 9:
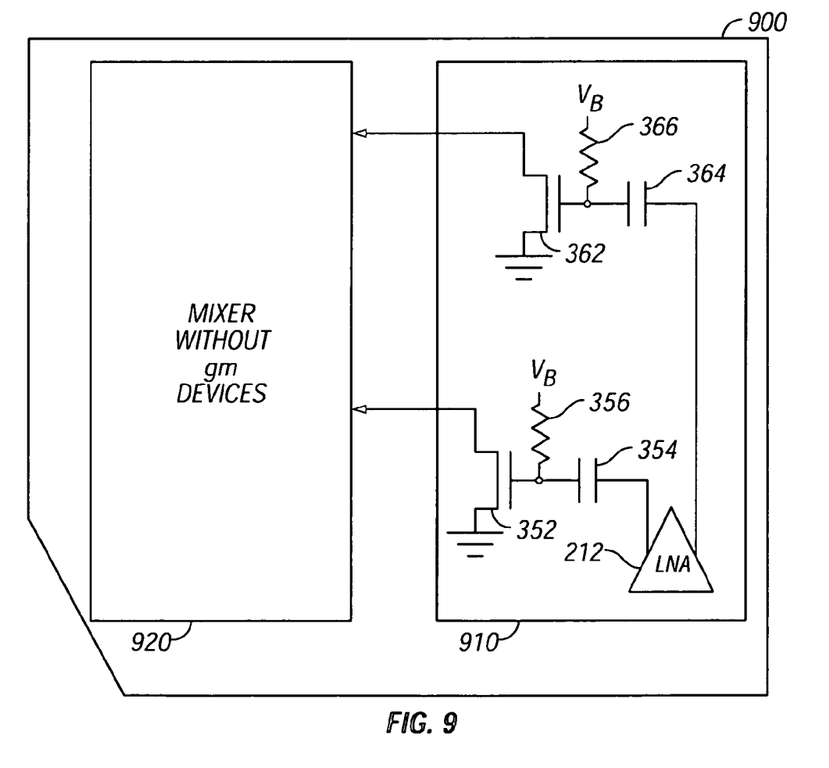
FIG. 9 illustrates a floor plan of a portion of an integrated circuit radio frequency receiver using the low noise amplifier of FIG. 3.

FIG. 9 illustrates a floor plan of portion of an integrated circuit RF receiver 900 using low noise amplifier 212 of FIG. 3. Portion 900 occupies a corner of the integrated circuit and other circuitry, bonding pads, etc. are not shown. Portion 900 includes generally a first layout block 910 and a second layout block 920. Layout block 910 includes LNA 212, and transistors 352 and 354 of the mixer stage. Layout block 920 includes all other elements necessary to form a mixer. For example in an analog implementation of the mixer layout block 920 would include nonlinear devices that multiply the differential current conducted at the drains of transistors 352 and 354 in response to a mixing signal. In a corresponding digital implementation of the mixer layout block 920 could include binarily-weighted current switches that are switched by a digitized local oscillator signal. However, these two examples are merely illustrative.

To maximize the gain of the amplifier, the quality factor (Q) of the load must be kept as high as possible. Series resistance with the gates of transistors 352 and 362 can severely reduce the Q. Since these devices are functionally a part of the mixer, they may be physically separated from the output of LNA 212 due to conventional integrated circuit layout techniques, thus increasing series resistance due to parasitic losses in signal routing over relatively long distances. To reduce this effect, transistors 352 and 362 have been combined with the rest of LNA 212 and laid out in close proximity to the drains of transistors 324 and 334 to substantially reduce the routing parasitic. On the other hand currents $I_{MIXN}$ and $I_{MIXP}$ provided at the drains of transistors 352 and 362 are inputs to a low impedance mixer node, and parasitic resistance due to signal routing can be better tolerated on these nodes.

The important advantage of integrated circuit receiver 900 is that the gates of transistors 352 and 354 are located as close to the outputs of LNA 212 as possible to avoid degrading the Q of the effective load through parasitic routing resistance. Signals $I_{MIXN}$ and $I_{MIXP}$ however are routed between layout blocks 910 and 920 because the subsequent operation is less sensitive to parasitic resistance. Thus the circuit components forming the mixer of the receiver are advantageously distributed between two different modular layout blocks.

Thus LNA 212 provides at least four significant benefits over known amplifiers. First, it includes a differential load between two amplifier stages to provide appropriate attenuation for operation in an AGC loop. Second, the mixer gm stage is located physically close to the LNA output to maximize the Q of the resonant load. Third, the attenuation device is broken up into multiple exponentially sized components to produce a desirable log-linear characteristic, with control voltage produced from gained, level-shifted versions of the AGC control voltage. Fourth, the amplifier transistor biasing is varied based on the relative gain, with a constant-gm biasing scheme selected for high gain and a constant $V_{DSAT}$ biasing scheme chosen for low gain, with the switchover point determined by the AGC control voltage.

In other embodiments, the conductivities of the MOS transistors could be reversed. While MOS transistors have been illustrated, other appropriate transistor types could be used where appropriate. Furthermore the circuitry that provides any of the advantages listed above could be employed alone or in various combinations to achieve desired results.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A low noise amplifier comprising:
   a first transconductance device having a control electrode for receiving a first input signal, and a first current electrode;
   a first load device having a first terminal coupled to a first power supply voltage terminal and a second terminal coupled to said first current electrode of said first transconductance device and forming a first output voltage signal thereon;
   a second transconductance device having a control electrode for receiving a second input signal, and a first current electrode;
   a second load device having a first terminal coupled to said first power supply voltage terminal and a second terminal coupled to said first current electrode of said second transconductance device and forming a second output voltage signal thereon; and
   an attenuation device coupled between said first current electrode of said first transconductance device and said first current electrode of said second transconductance device, and having a control input terminal for receiving a control voltage thereon;
   wherein said attenuation device comprises a plurality of exponentially-weighted attenuation devices.

2. The low noise amplifier of claim 1 wherein said first load device comprises a first inductor.

3. The low noise amplifier of claim 1 further comprising a second inductor coupled between a second current electrode of said first transconductance device and a second power supply voltage terminal.

4. The low noise amplifier of claim 1 wherein said first current electrode of said first transconductance device is coupled to said second terminal of said first load device through a cascode connected MOS transistor.

5. The low noise amplifier of claim 1 wherein said first transconductance device comprises an MOS transistor.

6. The low noise amplifier of claim 1 wherein said first and second input signals form a differential signal pair.

7. The low noise amplifier of claim 1 further comprising a biasing network coupled between said control electrodes of said first and second transconductance devices.

8. The low noise amplifier of claim 7 wherein said biasing network comprises:
   a first resistor having a first terminal coupled to said control electrode of said first transconductance device, and a second terminal;
   a second resistor having a first terminal coupled to said control electrode of said second transconductance device, and a second terminal coupled to said second terminal of said first resistor; and
   means for providing a current to a node formed by said second terminals of said first and second resistors.

9. The low noise amplifier of claim 8 wherein said means for providing said current comprises:
   a current source having a first terminal coupled to said first power supply voltage terminal, and a second terminal; and
   a transistor having a first current electrode coupled to said second terminal of said current source, a control electrode coupled to said first current electrode thereof, and a second current electrode coupled to a second power supply voltage terminal.

10. The low noise amplifier of claim 8 wherein said means for providing said current is operable in a selected one of first and second modes of operation.

11. The low noise amplifier of claim 1 wherein said control voltage comprises a plurality of control signals coupled to corresponding ones of said plurality of exponentially-weighted attenuation devices.

12. The low noise amplifier of claim 11 further comprising a voltage conversion circuit for converting said control voltage into said plurality of control signals.

13. The low noise amplifier of claim 12 wherein said voltage conversion circuit comprises a plurality of conversion circuits each comprising:
   an operational amplifier having a negative input terminal, a positive input terminal, and an output terminal for providing a respective one of said plurality of control signals;
   a voltage source coupled to said positive input terminal of said operational amplifier and providing a voltage thereto corresponding to a weight of its conversion circuit;
   a first resistor having a first terminal for receiving said control signal, and a second terminal coupled to said negative input terminal of said operational amplifier; and
   a second resistor having a first terminal coupled to said negative input terminal of said operational amplifier, and a second terminal coupled to said output terminal of said operational amplifier.

14. The low noise amplifier of claim 1 wherein each of said plurality of exponentially-weighted attenuation devices comprises an MOS transistor.

15. A low noise amplifier comprising:
   a first inductor having a first terminal coupled to a first power supply voltage terminal, and a second terminal forming a first output voltage signal thereon;
   a first transistor having a first current electrode coupled to said second terminal of said first inductor, a control electrode coupled to said first power supply voltage terminal, and a second current electrode;
   a second transistor having a first current electrode coupled to said second current electrode of said first transistor, a control electrode for receiving a first input signal, and a second current electrode;
   a second inductor having a first terminal coupled to said second current electrode of said second transistor, and a second terminal coupled to a second power supply voltage terminal;
   a third inductor having a first terminal coupled to said first power supply voltage terminal, and a second terminal forming a second output voltage signal thereon;
   a third transistor having a first current electrode coupled to said second terminal of said third inductor, a control electrode coupled to said first power supply voltage terminal, and a second current electrode;

a fourth transistor having a first current electrode coupled to said second current electrode of said third transistor, a control electrode for receiving a second input signal, and a second current electrode;

a fourth inductor having a first terminal coupled to said second current electrode of said fourth transistor, and a second terminal coupled to said second power supply voltage terminal; and an attenuation device coupled between said first current electrode of said first transistor and said first current electrode of said third transistor, and having a control input terminal for receiving a control voltage thereon.

16. The low noise amplifier of claim 15 wherein said first, second, third, and fourth transistors comprise N-channel MOS transistors.

17. The low noise amplifier of claim 15 wherein said attenuation device comprises a plurality of MOS transistors coupled in parallel and having gate width to gate length ratios that are exponentially-weighted.

18. The low noise amplifier of claim 17 wherein said control voltage comprises a plurality of control signals coupled to corresponding ones of said plurality of MOS transistors.

19. A low noise amplifier comprising:
an amplifier having a first input terminal for receiving a first input signal, a first output terminal for providing a first output signal, and a feedback input terminal for receiving a control voltage, wherein said control voltage determines a gain of said amplifier; and a bias circuit having an input terminal for receiving a control signal, and an output terminal coupled to said first input terminal of said amplifier for providing a bias voltage thereto, wherein said bias circuit is responsive to said control signal to operate in one of first and second modes, wherein in said first mode said bias circuit biases said amplifier to operate in a substantially constant transconductance mode, and in said second mode said bias circuit biases said amplifier to operate in a substantially constant saturation voltage mode.

20. The low noise amplifier of claim 19 wherein said amplifier is characterized as being a differential amplifier having said first input terminal for receiving said first input signal and a second input terminal for receiving a second input signal, and having said first output terminal for providing said first output signal and a second output terminal for providing a second output signal, wherein said first and second input signals and said first and second output signals each comprise differential signal pairs.

21. The low noise amplifier of claim 20 wherein said bias circuit comprises:
a current source having an output terminal for providing a first current while in said first mode and a second current while in said second mode;

a transistor having a first current electrode coupled to said output terminal of said current source, a control electrode coupled to said first current electrode thereof, and a second current electrode coupled to a power supply voltage terminal;

a first resistor having a first terminal coupled to said first current electrode of said transistor, and a second terminal coupled to said first input terminal of said amplifier; and a second resistor having a first terminal coupled to said first current electrode of said transistor, and a second terminal coupled to said second input terminal of said amplifier.

22. The low noise amplifier of claim 21 wherein said second current is larger than said first current.

23. The low noise amplifier of claim 19 wherein said amplifier comprises:
a first transconductance device having a control electrode for receiving said first input signal, and a first current electrode; and a first load device having a first terminal coupled to a first power supply voltage terminal and a second terminal coupled to said first current electrode of said first transconductance device and forming said first output signal thereon.

24. The low noise amplifier of claim 23 wherein said first load device comprises a first inductor.

25. The low noise amplifier of claim 24 wherein said amplifier further comprises a second inductor coupled between a second current electrode of said first transconductance device and a second power supply voltage terminal.

26. The low noise amplifier of claim 23 wherein said first current electrode of said first transconductance device is coupled to said second terminal of said first load device through a cascode connected MOS transistor.

27. The low noise amplifier of claim 23 wherein said first transconductance device comprises an MOS transistor.

28. A method for operating a low noise amplifier with automatic gain control comprising the steps of:
determining a power level of an output signal of the low noise amplifier;

providing a control voltage in response to said power level;

biasing the low noise amplifier to operate in a constant transconductance mode in response to said control voltage being less than a predetermined voltage; and biasing the low noise amplifier to operate in a constant saturation voltage mode in response to said control voltage being greater than said predetermined voltage.

29. The method of claim 28 wherein said step of determining said power level comprises the step of determining said power level of said output signal of the low noise amplifier by measuring a power at an output terminal of a mixer that also has an input terminal coupled to an output terminal of the low noise amplifier.

30. The method of claim 28 wherein said step of biasing the low noise amplifier to operate in said constant transconductance mode comprises the step of providing a first bias current and wherein said step of biasing the low noise amplifier to operate in said constant saturation voltage mode comprises the step of providing a second bias current higher than said first bias current.

31. A low noise amplifier comprising:
a first transconductance device having a control electrode for receiving a first input signal, and a first current electrode;

a first load device having a first terminal coupled to a first power supply voltage terminal and a second terminal coupled to said first current electrode of said first transconductance device and forming a first output voltage signal thereon;

a second transconductance device having a control electrode for receiving a second input signal, and a first current electrode;

a second load device having a first terminal coupled to said first power supply voltage terminal and a second terminal coupled to said first current electrode of said second transconductance device and forming a second output voltage signal thereon;

an attenuation device coupled between said first current electrode of said first transconductance device and said first current electrode of said second transconductance device, and having a control input terminal for receiving a control voltage thereon; and a biasing network coupled between said control electrodes of said first and second transconductance devices, said biasing network comprising:

a first resistor having a first terminal coupled to said control electrode of said first transconductance device, and a second terminal;

a second resistor having a first terminal coupled to said control electrode of said second transconductance device, and a second terminal coupled to said second terminal of said first resistor;

a current source having a first terminal coupled to said first power supply voltage terminal, and a second terminal; and a transistor having a first current electrode coupled to said second terminal of said current source, a control electrode coupled to said first current electrode thereof, and a second current electrode coupled to a second power supply voltage terminal.

* * * * *